(12) United States Patent
Brechignac et al.

(10) Patent No.: US 7,012,331 B2
(45) Date of Patent: Mar. 14, 2006

(54) DEVICE FOR MOUNTING A SEMICONDUCTOR PACKAGE ON A SUPPORT PLATE VIA A BASE

(75) Inventors: Rémi Brechignac, Grenoble (FR); Kevin Channon, Edinburgh (GB); Juan Exposito, St Nazaire les Eymes (FR)

(73) Assignee: STMicroelectronics S.A., (FR)

( * ) Notice: Subject to any disclaimer, the term of this patent is extended or adjusted under 35 U.S.C. 154(b) by 0 days.

(21) Appl. No.: 10/358,994

(22) Filed: Feb. 5, 2003

(65) Prior Publication Data

US 2003/0214028 A1 Nov. 20, 2003

(30) Foreign Application Priority Data

Feb. 6, 2002 (FR) .................................. 02 01427

(51) Int. Cl.
 *H01L 23/32* (2006.01)
(52) U.S. Cl. .................. 257/727; 257/680; 257/726; 257/731; 257/732
(58) Field of Classification Search ........ 257/432–434, 257/726–727, 731–732, 680–681, E23.181, 257/E23.193, E33.07; 438/116–117; 361/759, 361/789
 See application file for complete search history.

(56) References Cited

U.S. PATENT DOCUMENTS

| | | | | |
|---|---|---|---|---|
| 5,424,531 A | * | 6/1995 | O'Regan et al. ............. 250/216 |
| 5,816,828 A | * | 10/1998 | Ikeya et al. ................... 439/73 |
| 5,920,770 A | * | 7/1999 | Yasunaga et al. ............. 438/124 |
| 6,000,125 A | * | 12/1999 | Kang .......................... 29/832 |
| 6,020,635 A | * | 2/2000 | Murphy ....................... 257/727 |
| 6,518,659 B1 | * | 2/2003 | Glenn ......................... 257/704 |
| 6,565,374 B1 | * | 5/2003 | Corisis et al. ............... 439/300 |

FOREIGN PATENT DOCUMENTS

| | | |
|---|---|---|
| JP | 04-111686 | 4/1992 |
| JP | 111686 | 4/1992 |
| JP | 08-096911 | 4/1996 |
| JP | 096911 | 4/1996 |
| JP | 10-284205 | 10/1998 |
| JP | 284205 | 10/1998 |
| JP | 2000-284205 | 2/2000 |
| JP | 040572 | 2/2000 |
| JP | 2001-188155 | 7/2001 |
| JP | 188155 | 7/2001 |
| JP | 02001188155 A | * 7/2001 |

OTHER PUBLICATIONS

French Search Report, FA 616384/FR 0201427, dated Dec. 4, 2002.

(Continued)

*Primary Examiner*—Minhloan Tran
*Assistant Examiner*—Johannes Mondt
(74) *Attorney, Agent, or Firm*—Jenkens & Gilchrist, PC (57) ABSTRACT

A semiconductor package is mounted to a support plate through a base. The base is inserted between a rear face of the semiconductor package and a front face of the support plate. An electrical connection mechanism is provided to connect the semiconductor package to the support plate pass. This mechanism passes through the base. The mounting of the semiconductor package is accomplished by a variety of structures to fasten the package onto the said support plate. These structures cooperate with and are placed below the rear face of the semiconductor package.

14 Claims, 6 Drawing Sheets

OTHER PUBLICATIONS

Patent Abstracts of Japan, vol. 2000, No. 24, May 11, 2000; JP 2001 188155 A (Kuurii Components KK; Shinten Sangyo Co Ltd), Jul. 10, 2001.

Patent Abstracts of Japan, vol. 1999, No. 01, Jan. 29, 1999; JP 10 284205A (NEC. Corp), Oct. 23, 1998.

Patent Abstracts of Japan, vol. 2000, No. 05, Sep. 14, 2000; JP 2000 040572 A (NEC Eng Ltd), Feb. 8, 2000.

Patent Abstracts of Japan, vol. 1996, No. 08, Aug. 30, 1996; JP 08 096911 A (Shinano Polymer KK; Shin ETSU Polymer Co Ltd), Apr. 12, 1996.

Patent Abstracts of Japan, vol. 016, No. 354, (E-1242), Jul. 30, 1992; JP 04 111686 A (Cannon Inc), Apr. 13, 1992.

French Preliminary Search Report, FA 616384/FR 0201427, dated Dec. 4, 2002.

* cited by examiner

DEVICE FOR MOUNTING A SEMICONDUCTOR PACKAGE ON A SUPPORT PLATE VIA A BASE

PRIORITY CLAIM

The present application claims foreign priority from French Application for Patent No. 0201427 filed Feb. 6, 2002, the disclosure of which is hereby incorporated by reference.

BACKGROUND OF THE INVENTION

1. Technical Field of the Invention

The present invention relates to a device for mounting a semiconductor package on a support plate.

2. Description of Related Art

Semiconductor packages are known which contain optical semiconductor components having optical sensors on a front face and which have optical lenses in their front part.

To mount such packages on support plates, it is known to adhesively bond bases fitted on the sides with projecting tabs, the ends of which form catches, and to engage the semiconductor packages between these tabs, above the bases, such that the tabs extend laterally to the package and that their catches engage above the front face of the packages.

The aim of the present invention is in particular to reduce the footprint of devices for mounting semiconductor packages, in particular optical semiconductor packages, on support plates, in particular printed circuit boards.

SUMMARY OF THE INVENTION

According to the invention, the device for mounting a semiconductor package on a support plate, in which a base is inserted between a rear face of the package and a front face of the said support plate and in which means for electrically connecting the said package to the said support plate pass through the said base, comprises means for fastening the said package onto the said support plate which cooperate with and are placed below the rear face of this package.

According to an alternative embodiment of the invention, the said rear face of the package has at least one part projecting towards the said plate and the said fastening means cooperate with this projecting part.

According to the invention, the said fastening means preferably comprise additional coupling means provided on the said part projecting from the package and on the said base.

According to the invention, the said additional coupling means preferably comprise catches suitable for engaging with shoulders.

According to the invention, the said part projecting from the package preferably extends through the said base and is adhesively bonded to the support plate.

According to another alternative embodiment of the invention, the said part projecting from the package is adhesively bonded to the said base fastened to the support plate.

According to an alternative embodiment of the invention, the device comprises a fastening lug which passes through the said support plate and the said base, this lug having a shoulder away from the base and bearing on the rear face of the support plate and being fastened to the rear face of the said package.

According to the invention, the said lug is preferably fastened to the package by adhesive bonding.

According to the invention, the said package and the said base preferably comprise complementary centering parts engaging with each other.

According to an alternative embodiment of the invention, the said package and the said base have peripheries which substantially correspond.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
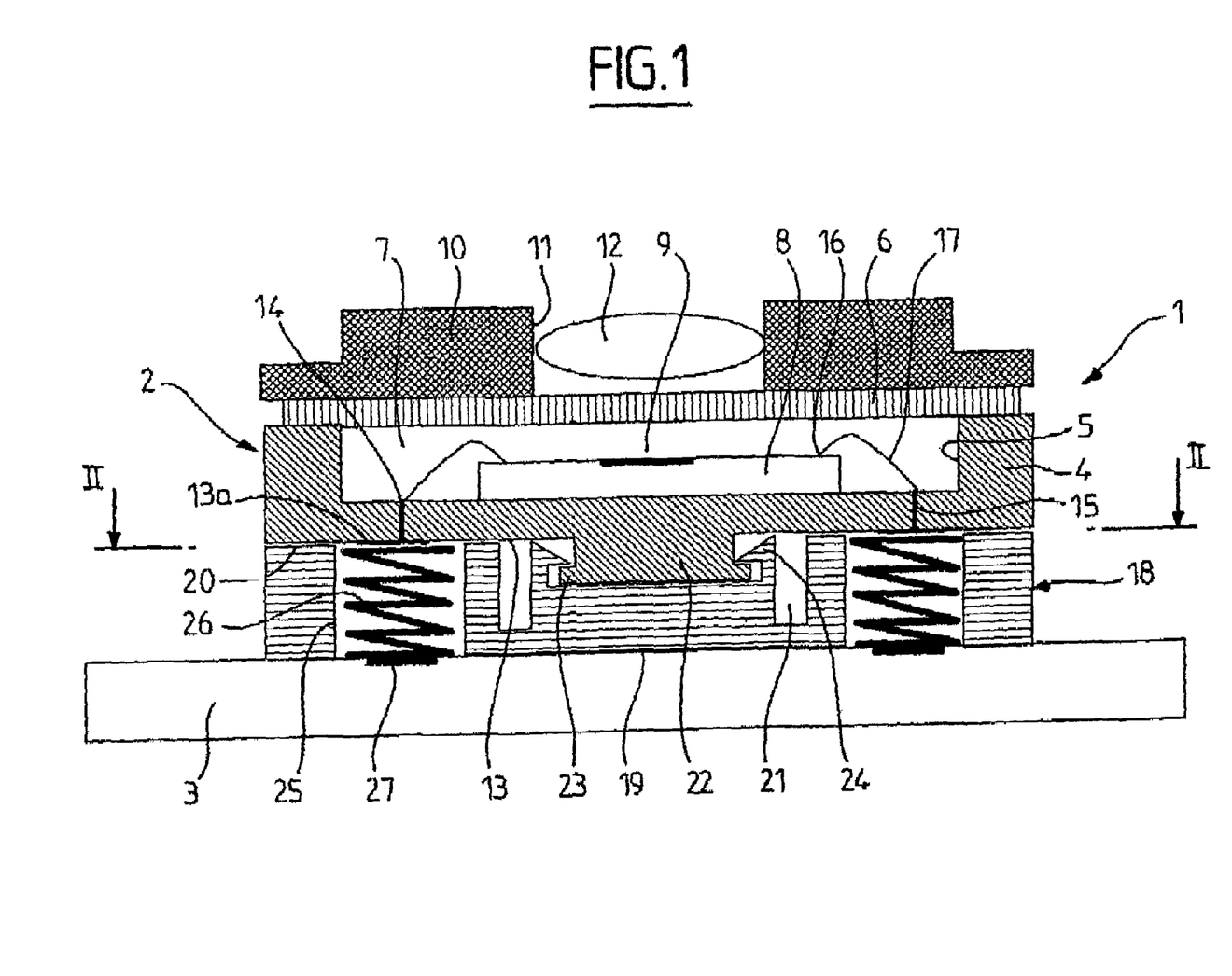
FIG. 1 shows a cross section of a first mounting device according to the present invention.
Figure 2:
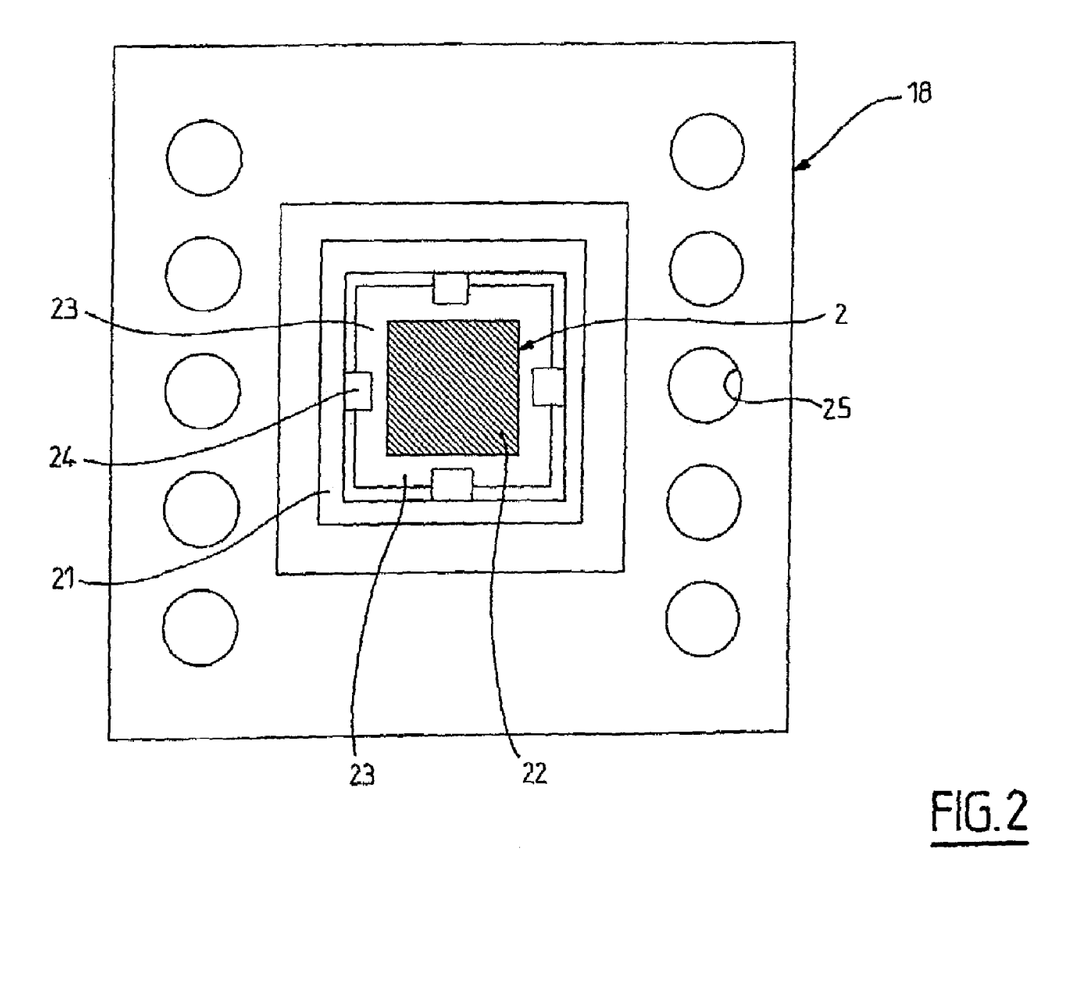
FIG. 2 shows a section through II—II of the mounting device of FIG. 1.

FIGS. 1 and 2 show a device 1 for mounting a semiconductor package 2 on a printed circuit support plate 3.

In the particular example shown, the semiconductor package 2 comprises a rear plate 4 which has, in its front face, a recess 5 and a transparent plate 6 adhesively bonded to the front face of the rear plate 4, so as to define a cavity 7. An optical semiconductor component 8 is fitted in this cavity 7, its rear face being adhesively bonded to the bottom of the recess 5 and its front face having an optical sensor 9 provided substantially in its central part.

The semiconductor package 2 further comprises a front plate 10 which is adhesively bonded to the transparent plate 6 and which has a central passage 11 in which an optical lens 12 is mounted so as to face the optical sensor 9.

The rear plate 4 of the semiconductor component 2 has, on its rear face, rear electrical connection pads 13 which are connected to inner electrical connection pads 14 provided in the recess 5 via an integrated circuit 15, the inner electrical connection pads 14 being connected to front electrical connection pads 16 of the optical semiconductor component 8 via electrical wires 17.

The periphery of the rear plate 4, the periphery of the transparent plate 6 and the periphery of the front plate 10 of the semiconductor component 2 substantially coincide and are substantially square.

Between the rear face 13 of the semiconductor package 2 and the support plate 3, the mounting device 1 comprises a base 18 comprising a plate, the rear face 19 of which is for example adhesively bonded or soldered to the support plate 3 and which has, in its front face 20, a central recess 21.

From its rear face 13 and in its central part with no electrical connection pad 13a, the rear plate 4 of the semiconductor package 2 has a part or boss 22 projecting rearwards, which is engaged in the central recess 21 of the base 18.

The end part of the projecting boss 22 has a peripheral lateral holding shoulder 23, away from the rear face 13, and the base 18 has, in its recess 21, holding catches 24 projecting towards the front and engaging with the annular shoulder 23.

Furthermore, the base 18 has, between its central recess 21 and its periphery, electrical connection through-passages 25, in which spiral electrical connection springs 26 are placed, making it possible to connect the rear electrical connection pads 13a of the semiconductor package 2 to electrical connection pads 27 provided on the support plate 3.

The periphery of the base 18 is substantially square and substantially coincides with the square periphery of the semiconductor package 2. The projecting boss 22 is substantially square, in parallel with the periphery of the semiconductor package 2 and, in the example, four catches 24 cooperate respectively with the four sides of the peripheral holding shoulder 23.

In order to fit the mounting device 1, it is possible to proceed as follows.

The base 18 is adhesively bonded or soldered onto the support plate 3 in a position such that its through-passages 25 correspond to the electrical connection pads 27 of this support plate 3.

The electrical connection springs 26 are placed in the passages 25.

The boss 22 of the semiconductor package 2 is engaged in the central recess 21 of the base 18 in the space between the catches 24 and in a position such that its rear electrical connection pads 13a correspond to the passages 25, until its rear face 13 comes into contact with the front face 20 of the base 18. This being done, the catches 24 are deformed laterally in the recess 21, in order to engage towards the inside with the annular shoulder 23 of the central boss 22 of the semiconductor package 2 and the springs 26 are compressed.

Thus, the catches 24 and the annular shoulder 23 of the central boss 22 constitute not only additional means for coupling the semiconductor package 2 to the base 18 but also additional parts for centering the semiconductor package 2 with respect to the base 18, one being engaged in the other.

Figure 3:
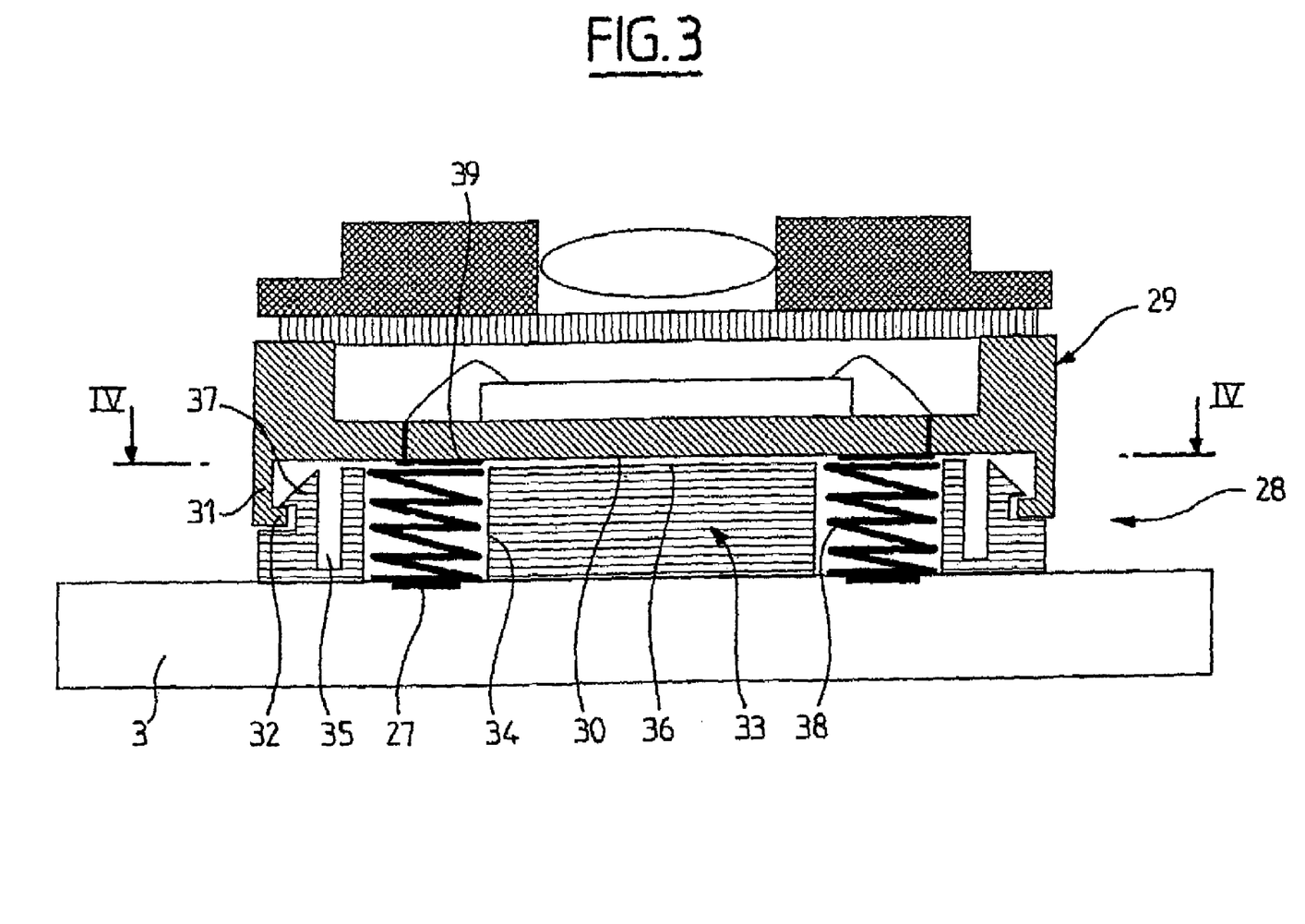
FIG. 3 shows a cross section of a second mounting device according to the present invention.
Figure 4:
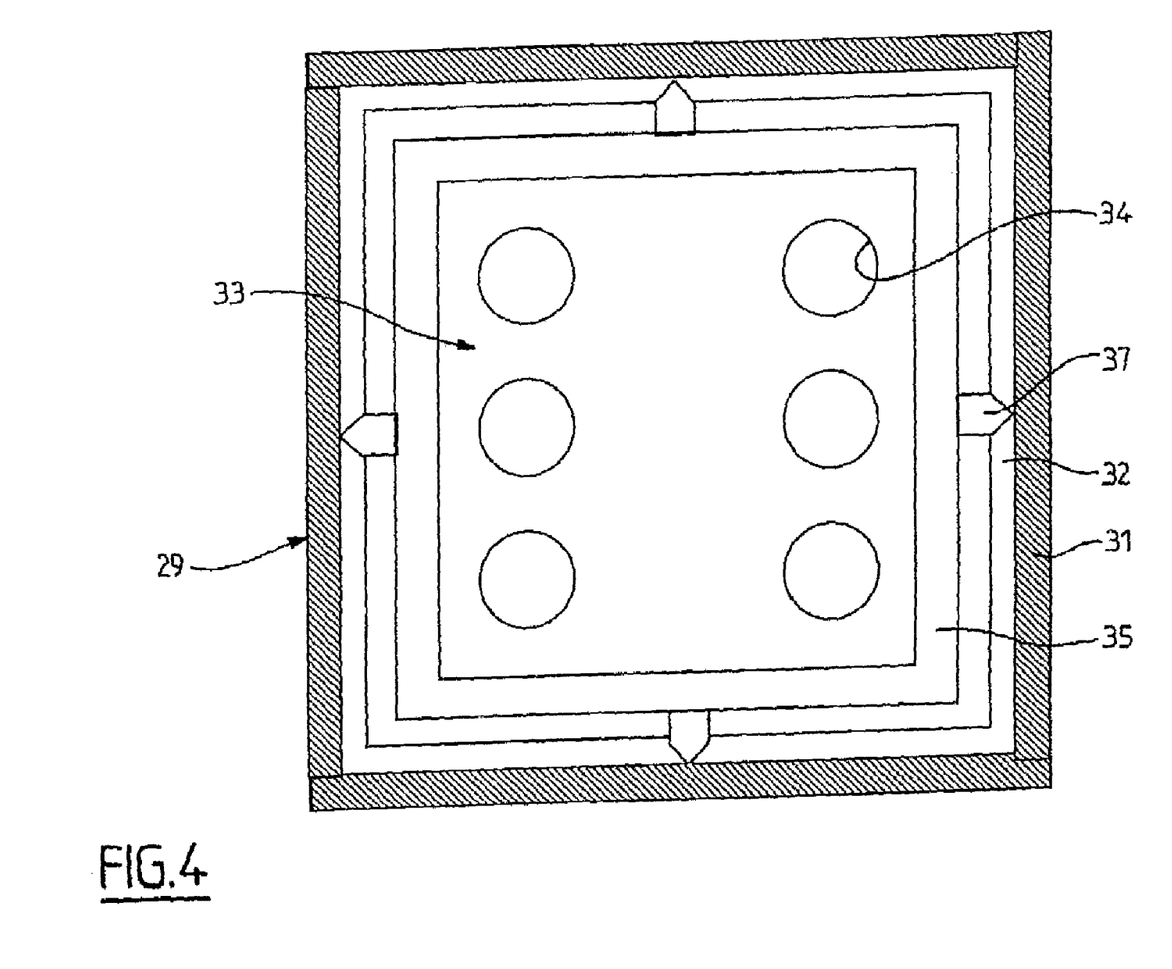
FIG. 4 shows a section through II—II of the mounting device of FIG. 1.

With reference now to FIGS. 3 and 4, it can be seen that a mounting device 28 is shown which is differentiated from the mounting device 1 described with reference to FIGS. 1 and 2 by the following points.

The optical semiconductor component 29 is differentiated from the semiconductor component 2 in that it does not have the rear projecting boss 22 but that it has a peripheral rib 31 projecting rearwards from the periphery of its rear face 30 and which has, at its end, an inner holding rim or shoulder 32 projecting away from the rear face 30.

Its base 33 is differentiated from the base 18 of the previous example in that it has no central recess 21, but that it has, between its periphery and its through-passages 34 corresponding to the previous passages 25, an annular channel 35 made in its front face 36 and that, in its part separating its periphery and the groove 35, holding catches 37 are formed projecting forwards and suitable for external engagement with the shoulder 32.

To fit the mounting device 28, it is possible to proceed as in the previous example.

The base 33 is adhesively bonded or soldered onto the support plate 3 in a position such that its through-passages 34 correspond to the electrical connection pads 27.

Electrical connection springs 38 are placed in its passages 34.

The rib 31 projecting to the rear of the semiconductor package 29 is engaged around the catches 37 of the base 28 and in a position such that its rear electrical connection pads 39 correspond to the passage 34, until its rear face 30 comes into contact with the front face 36 of the base 33, the catches 37 being deformed laterally in order to engage externally with the annular shoulder 32 of the peripheral rib 31 and the springs 38 being compressed.

Figure 5:
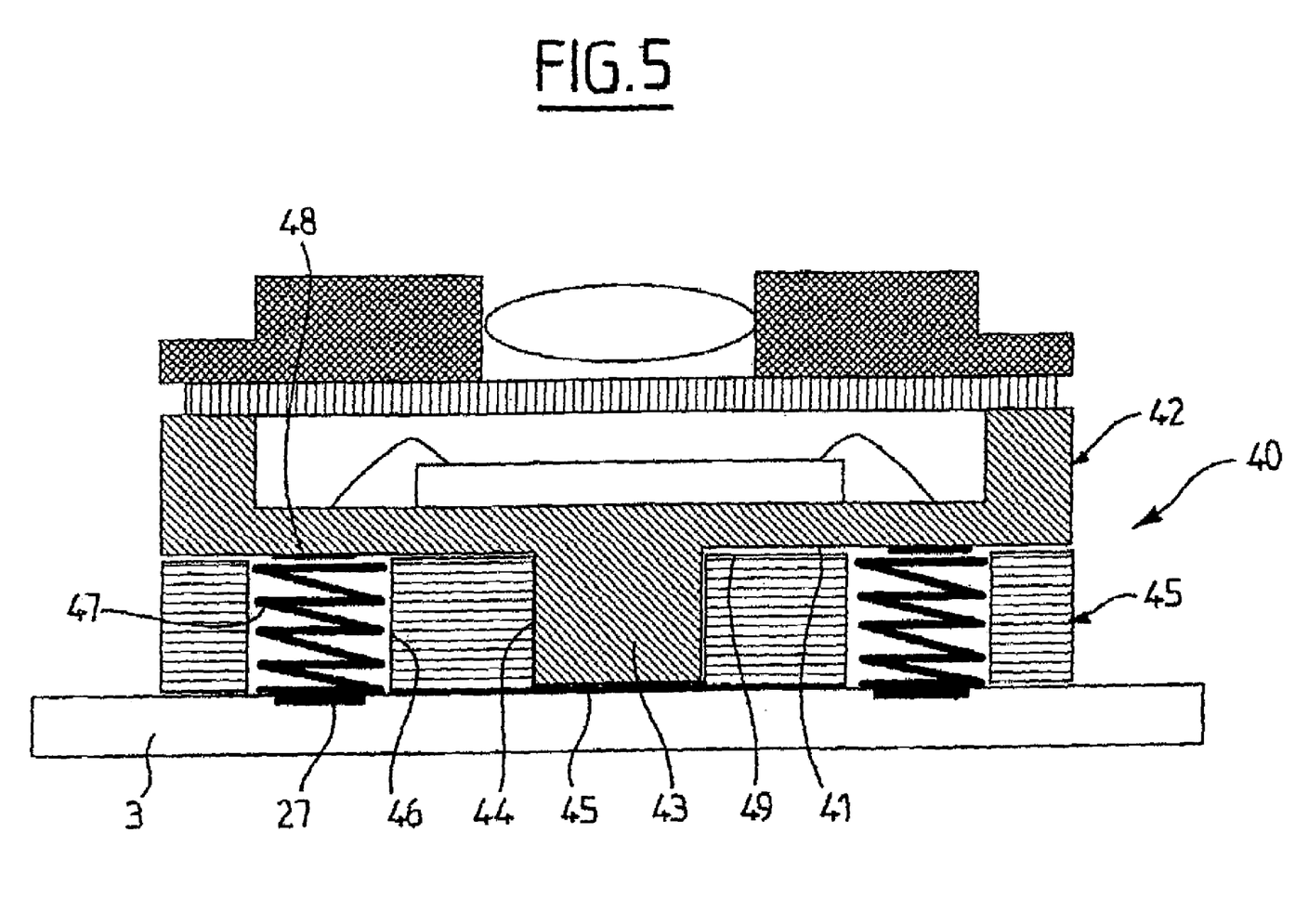
FIG. 5 shows a cross section of a third mounting device according to the present invention.

With reference to FIG. 5, a mounting device 40 is shown which is differentiated from the previously described examples in that it no longer has catches.

So, in this mounting device 40, the rear face 41 of the optical semiconductor component 42 has a central part or boss 43 projecting rearwards, with a square cross section, which is engaged in a central passage 44 of square cross section of a base 45, until its end is in contact or at a short distance from the support plate 3.

A layer of adhesive 45 is inserted between the end face of the boss 43 and the front face of the support plate 3.

To fit the mounting device 40, it is possible to proceed as follows.

The base 45 is adhesively bonded or soldered onto the support plate 3 in a position such that its through-passages 46 correspond to the electrical connection pads 27 of this support plate 3.

The electrical connection springs 47 are placed in the passages 46.

A drop or a layer of adhesive is deposited on the support plate 3 through the central passage 44 of the base 45 and/or on the front face of the rear boss 43 of the semiconductor package 42.

The rear boss 43 of the semiconductor package 42 is engaged in the central passage 44 of the base 45, in a position such that its rear electrical connection pads 48 correspond to the through-passages 46 and until the layer of adhesive 45 is inserted between the front face of the boss 43 and the support plate 3, the rear face 41 of the semiconductor package 42 then being in contact with, or a short distance from, the front face 49 of the base 45.

When the layer of adhesive 45 is set, the semiconductor package 42 is fastened to the support plate 3, the rear boss 43 providing the coupling and the centering of one with respect to the other.

Figure 6:
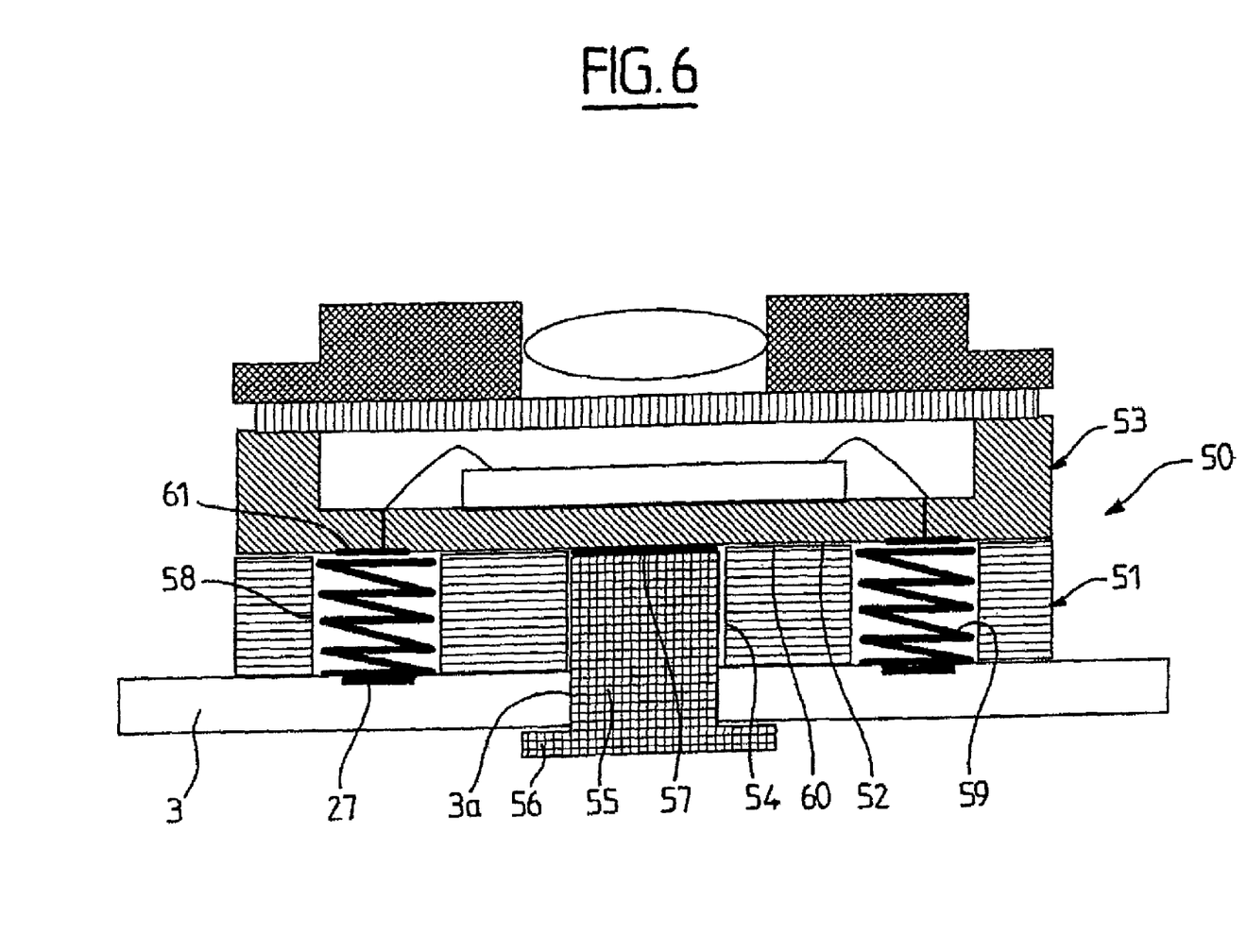
FIG. 6 shows a cross section of a fourth mounting device according to the present invention.

With reference to FIG. 6, a mounting device 50 is shown in which the base 51 corresponds to the base 45 of the previous example, and in which the rear face 52 of the semiconductor package 53 is flat.

In this example, the support plate 3 has a through-passage 3a located so as to face the central passage 54 of the base 51.

A holding lug 55 is engaged through the passage 3a of the support plate 3 and of the central passage 54 of the base 51, this lug 55 having a peripheral shoulder 56 bearing against the rear face of the support plate 3 and a layer of adhesive 57 being inserted between the front face of the lug 55 and the rear face 52 of the optical semiconductor package 53.

To fit the mounting device 50, it is possible to proceed as follows.

The base 51 is adhesively bonded or soldered onto the support plate 3 in a position such that the electrical connection through-passages 58 correspond to the electrical connection pads 27 of the support plate 3 and that its central passage 54 corresponds to the through-passage 3a of the support plate 3.

The electrical connection springs 9 are placed in the through-passages 58 of the base 51.

A drop or a layer of adhesive is deposited on the end face of the holding lug 55 and/or on the central part of the rear face 52 of the optical semiconductor device 53.

The optical semiconductor package 53 is put on the front face 60 of the base 51 by compressing the springs 59, in a position such that its rear electrical connection pads 61 correspond to the through-passages 58.

The lug 55 is engaged through the through-passage 3a of the support plate 3 and through the central passage 54 of the base 51 until the front end of the holding lug 55 comes into contact with the rear face 52 of the optical semiconductor package 53 via the layer of adhesive 57 thus formed.

After this adhesive is set, the optical semiconductor package 53 is fastened to the support plate 3.

Furthermore, the optical semiconductor package 53 and the base 51 could have complementary centering parts making it easier to position one with respect to the other during their coupling. For this, the optical semiconductor package 53 could have, for example, pins projecting rearwards and the base 51 could have front holes for receiving these pins.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A device for mounting a semiconductor package on a support plate, comprising:
    a base is inserted between a rear face of the semiconductor package and a front face of the support plate;
    elastic means for electrically connecting the semiconductor package to the support plate, wherein the elastic means pass through passages in the base member, and
    means for fastening the semiconductor package onto the support plate, wherein the means for fastening cooperates with and is placed below the rear face of the semiconductor package,
    wherein the rear face of the semiconductor package has at least one part projecting towards the support plate and in that the means for fastening cooperates with this projecting part.

2. The device according to claim 1, wherein the means for fastening comprises additional coupling means provided on the projecting part from the semiconductor package and on the base.

3. The device according to claim 2, wherein the additional coupling means comprises catches on the projecting part and base suitable for engaging with each other.

4. A semiconductor product, comprising:
    a semiconductor package securing an integrated circuit, the semiconductor package having a rear face surface and a boss member projecting rearwardly therefrom;
    a holding shoulder associated with the rearwardly projecting boss member;
    a mounting base including an aperture sized and shaped to receive the rearwardly projecting boss member; and
    a latch mechanism associated with the mounting base, the latch mechanism engaging the holding shoulder to retain the semiconductor package in the mounting base when the rearwardly projecting boss member is inserted into the aperture.

5. The semiconductor product as in claim 4 further including a printed circuit support plate to which the mounting base is attached.

6. The semiconductor product as in claim 5 further including electrical interconnection structure in the mounting base for electrically connecting the semiconductor package to the printed circuit support plate.

7. The semiconductor product as in claim 4 wherein the integrated circuit comprises an optical semiconductor component.

8. The semiconductor product as in claim 7 further including a transparent plate overlying a front face surface of the semiconductor package to optically expose the optical semiconductor component.

9. The semiconductor product as in claim 8 further including:
    a front plate bonded to the transparent plate, the front plate including a central passage therein; and
    an optical lens mounted within the central passage.

10. The semiconductor product as in claim 4 wherein the holding shoulder is a peripheral structure.

11. The semiconductor product as in claim 4 wherein the latch mechanism comprises a plurality of deformable holding catches which engage the holding shoulder.

12. A device for mounting a semiconductor package to a supporting base, the supporting base being mounted to a printed circuit board, comprising:
    means for fastening the semiconductor package onto the supporting base, wherein the means for fastening cooperates with and is placed below a rear face of the semiconductor package; and
    means for making an elastic electrical connection from the printed circuit board to the semiconductor package, wherein the elastic electrical connection extends through the supporting base,
    wherein the semiconductor package includes a projecting member extending rearwardly from the rear face of the semiconductor package, and wherein the means for fastening engages the projecting member.

13. The device according to claim 12, wherein the means for fastening comprises coupling means provided on both the projecting member and on the supporting base.

14. The device according to claim 13, wherein the coupling means comprises catches suitable for engaging with each other.

* * * * *